(12) United States Patent
Kobayashi

(10) Patent No.: US 6,493,408 B1
(45) Date of Patent: Dec. 10, 2002

(54) LOW-JITTER DATA TRANSMISSION APPARATUS

(75) Inventor: Eiichi Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/443,005

(22) Filed: Nov. 18, 1999

(30) Foreign Application Priority Data

Nov. 18, 1998 (JP) ............................................ 10-327663

(51) Int. Cl.[7] ................................................. H04L 7/00
(52) U.S. Cl. ...................... 375/357; 375/355; 375/356; 375/376; 375/287; 375/219
(58) Field of Search ................................. 375/219, 287, 375/371, 354, 355, 356, 357, 373, 376

(56) References Cited

U.S. PATENT DOCUMENTS 5,805,650 A * 9/1998 Belot et al. ................. 331/1 R
6,243,369 B1 * 6/2001 Grimwood et al. ......... 370/335

FOREIGN PATENT DOCUMENTS

| JP | 2-166919 | 6/1990 |
|----|----------|--------|
| JP | 7-131492 | 5/1995 |
| JP | 7-326963 | 12/1995 |

* cited by examiner

*Primary Examiner*—Chi Pham
*Assistant Examiner*—Pankaj Kumar
(74) *Attorney, Agent, or Firm*—Foley & Lardner

(57) ABSTRACT

For restraining jitter amount of a transmission clock signal (16) generated by a digital PLL (8), a data transmission apparatus comprises a 1/24 clock generator (6) for dividing frequency of a receiving clock signal (4), a clock multiplier (7) for generating a reference frequency signal (18) by multiplying frequency of the output of the 1/24 clock generator (6), and a control unit (28) for controlling a frequency multiplying ratio of the clock multiplier (7) and controlling a frequency dividing ratio of a frequency divider provided in the digital PLL (8). According to jitter amount detected by a jitter detection signal generator (19), the frequency of the reference clock signal (18) is selected among 1/12, 1/8 and 1/6 of the frequency of the receiving clock signal.

5 Claims, 4 Drawing Sheets

LOW-JITTER DATA TRANSMISSION APPARATUS

BACKGROUND OF THE INVENTION

The present invention relates to a data transmission apparatus wherein ATM (Asynchronous Transfer Mode) cells are transmitted according to a clock signal generated in synchronization with a clock signal of receiving ATM cells.

FIG. 3 is a block diagram illustrating a conventional example of a data transmission apparatus of this type.

Referring to FIG. 3, an optical signal carrying ATM cell data, STM-1 (Synchronous Transport Module 1) signal, for example, is transmitted through an optical cable 14 and inputted to an O/E (Optic/Electric) transducer 1. The O/E transducer 1 converts the optical signal into an electric signal, from which a receiving data signal 3 and a receiving clock signal 4 are extracted and supplied to a receiver-side terminator 2.

In the receiver-side terminator 2, a receiving cell-data signal 5 is reproduced from the receiving data signal 3 and the receiving clock signal 4.

The receiving clock signal 4 is also supplied to a clock generator 31 to be frequency-divided thereby. The output of the clock generator 31 is frequency-multiplied by a clock multiplier 32 and supplied to a digital PLL (Phase Lock Loop) 34 as a reference frequency signal 33.

Therefore, the frequency of the reference frequency signal 33 can be represented as F/M, F being the frequency of the receiving clock signal 4 and M being a rational number. However, in the following paragraphs, the frequency dividing ratio M is assumed to be a positive integer for simplifying the description.

FIG. 4 is a block diagram illustrating an example of an inner configuration of the digital PLL 34 of FIG. 3, comprising a clock oscillator 800, a controllable frequency divider 801, a phase comparator 802 and a 1/M frequency divider 804. When the frequency dividing ratio M is not an integer, the 1/M frequency divider 804 may be replaced with an appropriate combination of a frequency multiplier and a frequency divider.

In the example of FIG. 4, the oscillation frequency f of the clock oscillator 800 is designed to be f≈nF, n being a positive integer.

Here, it should be noted that the oscillation frequency f and the. receiving clock frequency F are both subject to their own fluctuation. However, the value of n, and consequently the oscillation frequency f, are so selected as to satisfy a condition $f/(n-1) > F > f(n+1)$.

The controllable frequency divider 801, consisting of a programmable counter, for example, is controlled to divide the oscillation frequency f by n−1, n or n+1. When the dividing ratio of the controllable frequency divider 801 is controlled to be 1/n, an output clock signal 35 of a frequency f/n≈F is outputted from the controllable frequency divider 801, and the output frequency of the 1/M frequency divider 804 becomes almost F/M.

Phases of the output of the 1/M frequency divider 804 and the reference frequency signal 33 (of the frequency F/M) are compared by the phase comparator 802. When the output phase of the 1/M frequency divider 804 is delayed from the phase of the reference frequency signal 33, the phase comparator 801 enables an UP signal, which controls the frequency dividing ratio of the controllable frequency divider 801 to be n−1) and the phase of the output clock signal 35 advances.

When the output phase of the 1/M frequency divider 804 is leading from the phase of the reference frequency signal 33, the phase comparator 801 enables a DOWN signal. By the DOWN signal, the frequency dividing ratio of the controllable frequency divider 801 is controlled to be (n+1), delaying the phase of the output clock signal 35 so that the output phase of the 1/M frequency divider 804 coincides with the phase of the reference frequency signal 33 outputted from the clock multiplier 32.

Thus, the phase of the output clock signal 35 of the digital PLL 34 is maintained in synchronization with the receiving clock signal 4.

Returning to FIG. 3, a transmitter-side signal generator 10 generates a transmission data signal 11 from a transmission cell data 13 and a transmission clock signal 12 making use of the output clock signal 35 of the digital PLL 34. The transmission data signal 11 and the transmission clock signal 12 are converted into an optical signal by an E/O (Electric/Optic) transducer 9 and transmitted through an optical cable 15.

In the conventional data transmission apparatus as above described, there has been a problem that the transmission data signal 11 is affected by jitters of the output clock signal 35 generated by the digital PLL 34.

As can be easily understood from FIG. 4, the frequency of the out-put clock signal 35 may change discontinuously from one of f/(n−1), f/n and f/(n+1) to another of them, under control of the phase comparator 802. This discontinuous change of the output frequency of the digital PLL 34 causes the jitter of the transmission clock signal 12 and when the jitter exceeds its tolerance level, it causes data transmission errors such as cell losses of the data transmission apparatus.

There have been proposed several countermeasures for restraining the jitter of the digital PLL.

By making large the frequency dividing ratio n of the controllable frequency divider 801 together with the oscillation frequency f of the clock oscillator 800, the jitter amount can be restrained. However, the condition f/n−1) >F>f(n+1) can not be satisfied and it becomes difficult for the output frequency of the digital PLL 34 to follow the reference frequency F/M adequately.

In a Japanese patent application laid open as a Provisional Publication No. 166919/'90 entitled "A Digital PLL System", there is disclosed a digital PLL similar to the digital PLL of FIG. 4, which comprises a plurality of controllable frequency dividers 801. By phase-shifting the output of a clock oscillator 800, a plurality of clock signals of a frequency f and each having a phase different with each other are generated. Each of the clock signals is supplied to a respective one of the controllable frequency dividers 801 to be frequency-divided by (n−1), n or (n+1). According to output of a phase comparator 802, output of an appropriate one of the controllable frequency dividers 801 is selected to be outputted as the output clock signal 35 of the digital PLL.

Thus, the jitter amount is restrained in this prior art without enlarging the frequency dividing ratio n.

When the frequency dividing ratio n is made large together with the oscillation frequency f, the pull-in time, which is needed for the phase difference detected by the phase comparator 802 being controlled to zero, becomes long. For dealing with this problem, another prior art is disclosed in a Japanese patent application laid open as a Provisional Publication No. 131492/'95 entitled "A Multi-Relay System", wherein two digital PLLs are cascade-connected. In the first stage PLL, the oscillation frequency of the clock oscillator is designed to be comparatively low for shortening the pull-in time, while the oscillation frequency of the clock oscillator is designed to be comparatively high in the second stage PLL for restraining the jitter amount.

In still another Japanese patent application laid open as a Provisional Publication No. 326963/'95 entitled "A Digital PLL Circuit", the jitter amount is restrained without prolonging the pull-in time, by controlling the duration ratio of the controllable frequency divider for dividing the oscillation frequency f by n and n−1, or the duration ratio for dividing by n and n+1, depending on the polarity and the absolute value of the output of the phase comparator.

However, there has been disclosed no idea to control the digital PLL according to the jitter amount actually detected, in any of these prior arts. It is preferable that the jitter amount of the transmission clock signal is as small as possible. However, in practical use, it is sufficient when the jitter amount is smaller than a tolerance level for performing data transmission without error.

SUMMARY OF THE INVENTION

Therefore, a primary object of the present invention is to provide a data transmission apparatus wherein the frequency of the reference frequency signal supplied to the digital PLL is selected according to jitter amount actually detected, for realizing a simple and efficient apparatus for transmitting ATM cells according to a clock signal generated in synchronization with a clock signal of receiving ATM cells.

In order to achieve the object, a data transmission apparatus according to the invention comprises:

- a receiving clock generator for dividing a frequency of a receiving clock signal which is extracted from a receiving optical signal carrying ATM cells;
- a clock multiplier for generating a reference frequency signal by multiplying a frequency of an output of the receiving clock generator;
- a digital PLL for generating an output clock signal referring to the reference frequency signal;
- a transmission-side signal generator for generating a transmission data signal and a transmission clock signal to be multiplexed into a transmission optical signal in synchronization with the output clock signal;
- a control unit for controlling a frequency multiplying ratio of the clock multiplier and controlling a frequency dividing ratio of a frequency divider provided in the digital PLL corresponding to the frequency multiplying ratio;
- a jitter detection signal generator for generating a jitter detection signal indicating a jitter amount relative to the receiving clock signal and the transmission clock signal;
- a comparator for comparing the jitter detection signal to a threshold value; and
- a clock selector for selecting a frequency of the reference frequency signal, according to which the control unit controls the frequency dividing ratio of the frequency divider and the frequency multiplying ratio of the clock multiplier.

The data transmission apparatus may preferably comprise a monitor display for displaying a current value of the jitter amount indicated by the jitter detection signal.

The data transmission apparatus may preferably comprise also a jitter amount register for storing the jitter amount being associated with each possible frequency multiplying ratio of the clock multiplier, referring to which the clock selector selects the frequency of the reference frequency signal.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
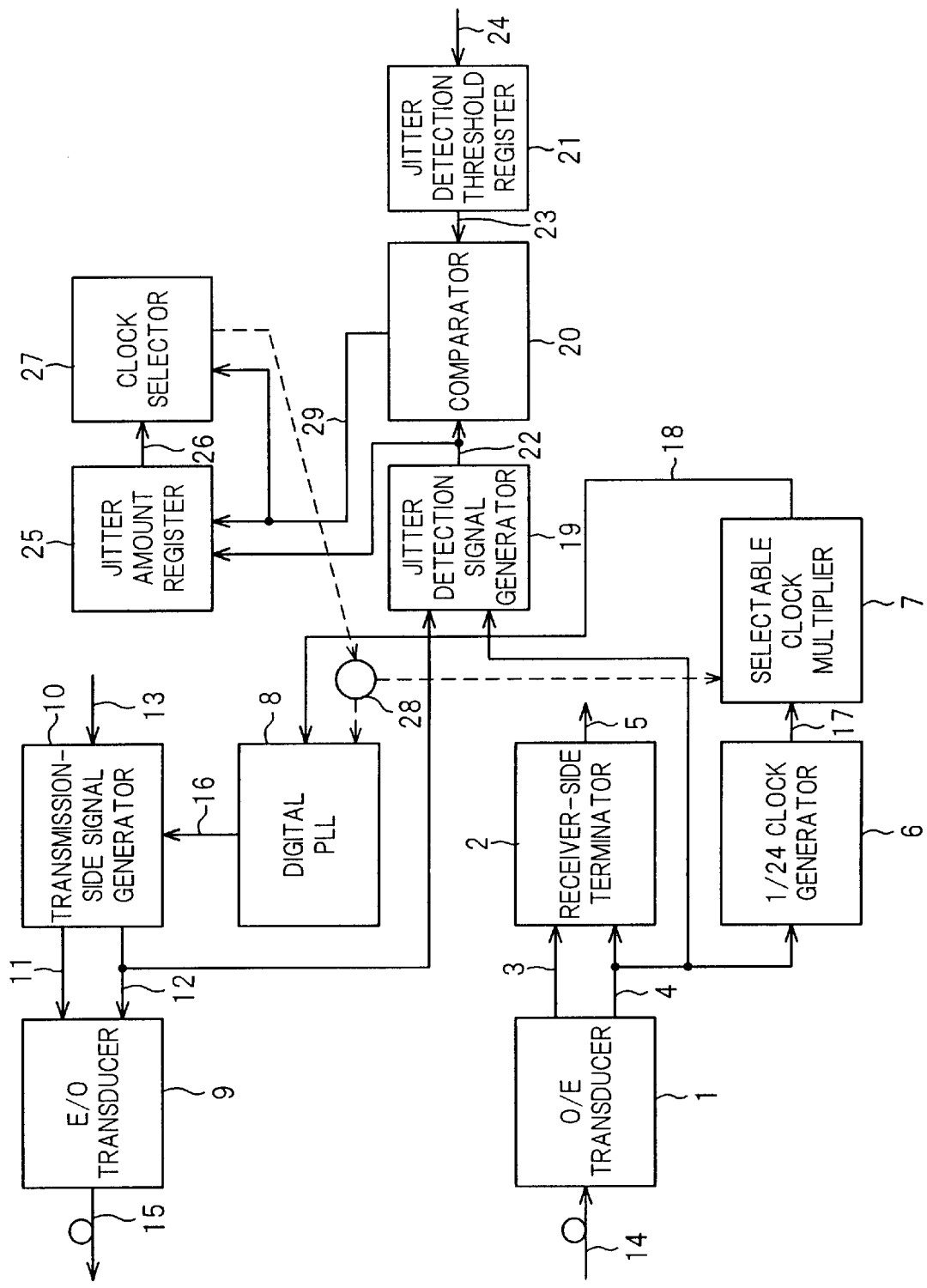
FIG. 1 is a block diagram illustrating an embodiment of the invention.

FIG. 1 is a block diagram illustrating an embodiment of the invention. In FIG. 1, a numeral 6 denotes a ¹⁄₂₄ clock generator which corresponds to the clock generator 31 of FIG. 3. A numeral 7 denotes a selectable clock multiplier. The selectable clock multiplier 7 corresponds to the clock multiplier 32 of FIG. 3. In the clock multiplier 32 of FIG. 3, the frequency multiplying ratio was fixed. However, in the selectable clock multiplier 7 of FIG. 1, a desired frequency multiplying ratio can be selected among several frequency multiplying ratios, 2, 3 and 4, for example, prepared therein.

A numeral 8 denotes a digital PLL. The difference of the digital PLL 8 of FIG. 1 compared to the digital PLL 34 of FIG. 3 will be described afterwards referring to FIG. 2.

Figure 3:
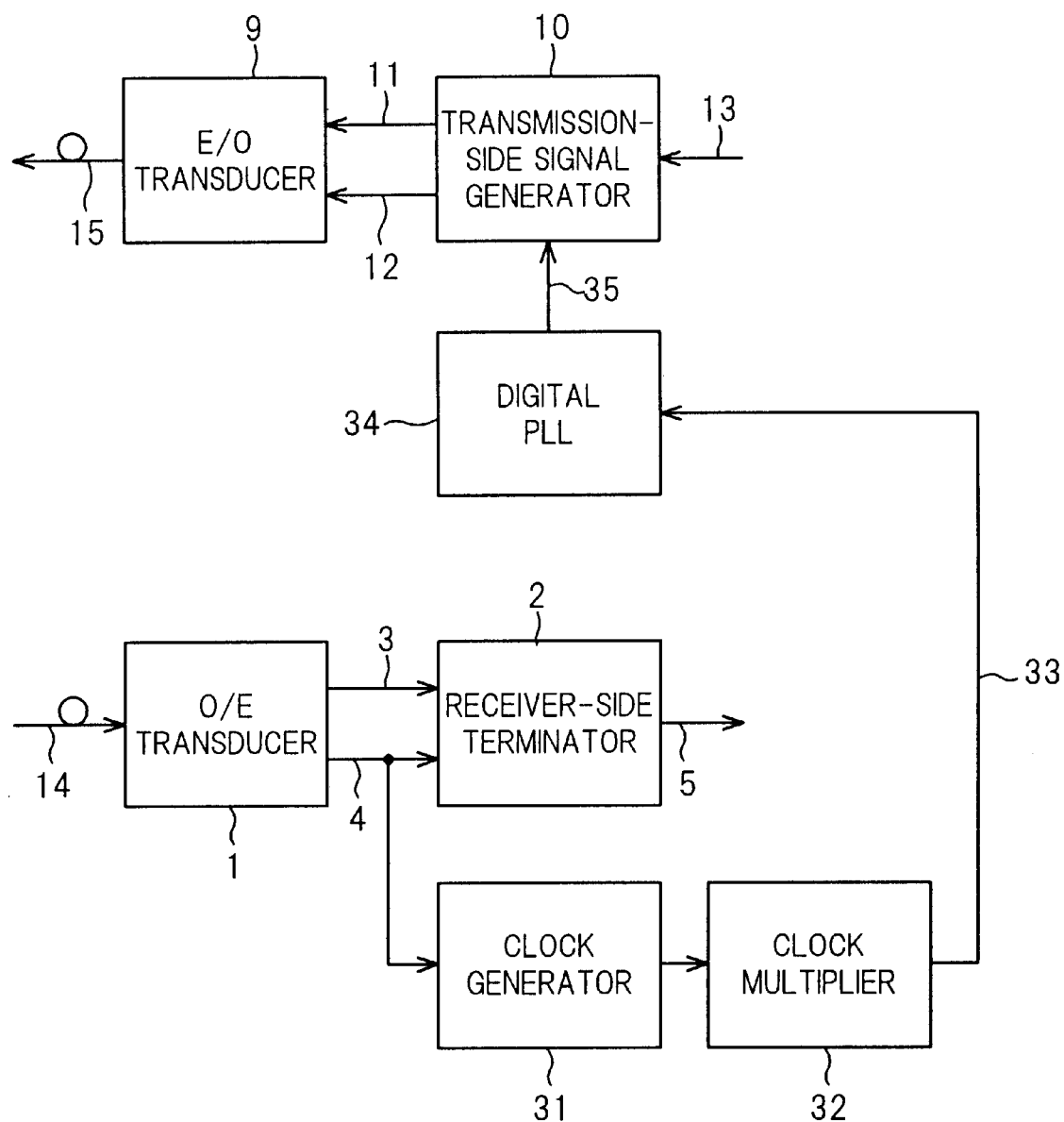
FIG. 3 is a block diagram illustrating a conventional example of a data transmission apparatus.

A numeral 16 denotes an output clock signal, corresponding to the output clock signal 35 of FIG. 3, of the digital PLL 8. A numeral 17 denotes an output of the ¹⁄₂₄ clock generator 6, and a numeral 18 denotes a reference frequency signal corresponding to the reference clock signal 33 of FIG. 3.

The data transmission apparatus of FIG. 1 further comprises a jitter detection signal generator 19, a comparator 20, a jitter detection threshold register 21, a jitter amount register 25, a clock selector 27 and a control unit 28.

A numeral 22 denotes a jitter detection signal generated by the jitter detection signal generator 19, a numeral 23 denotes an output signal of the jitter detection threshold register 21, a numeral 24 denoted an input signal to the jitter detection threshold register 21, a numeral 26 denotes an output signal of the jitter amount register 25, and a numeral 29 denotes an output signal of the comparator 20.

Figure 2:
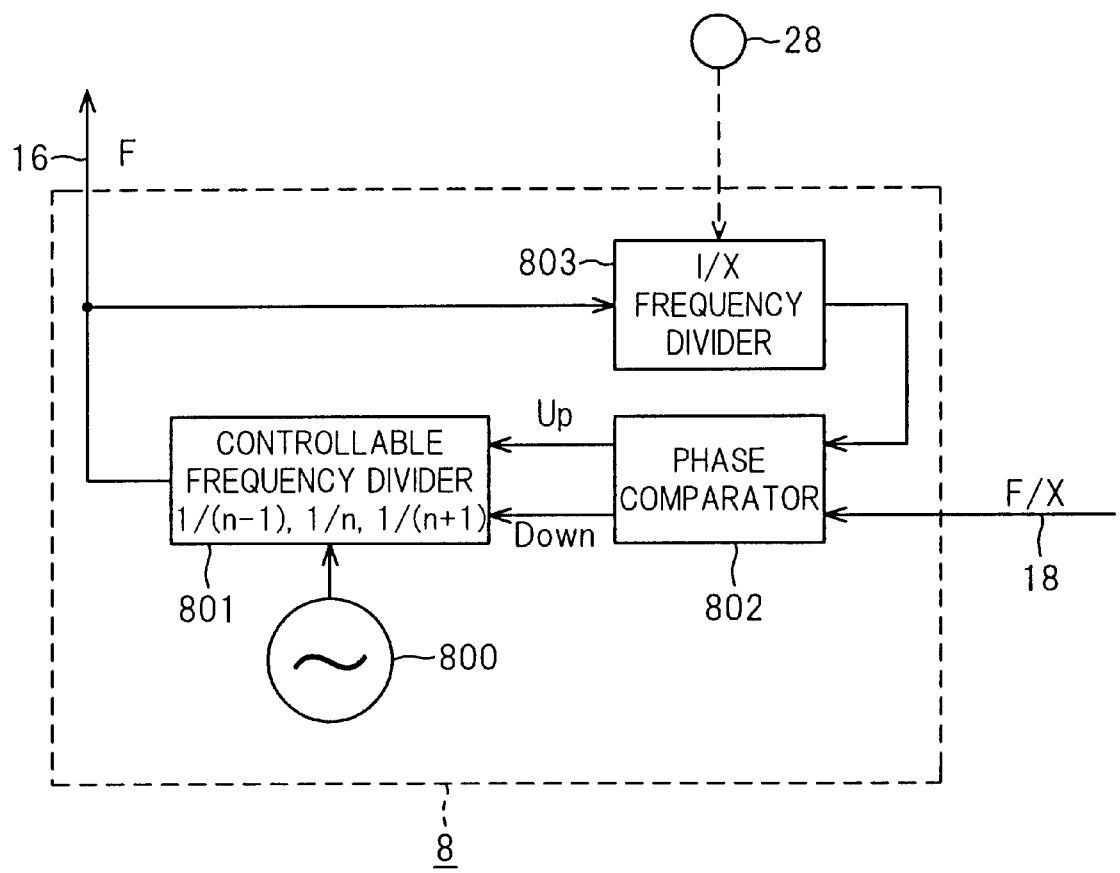
FIG. 2 is a block diagram illustrating an inner configuration of the digital PLL 8 of FIG. 1.
Figure 4:
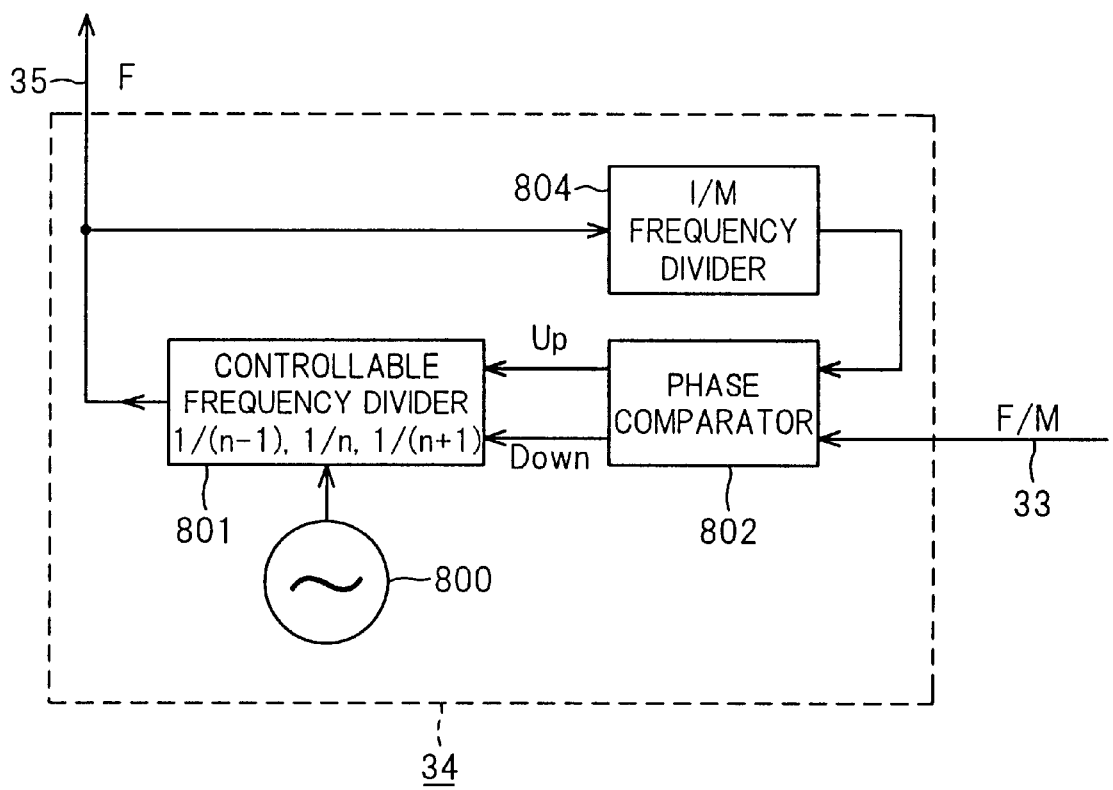
FIG. 4 is a block diagram illustrating an example of an inner configuration of the digital PLL 34 of FIG. 3.

FIG. 2 is a block diagram illustrating an inner configuration of the digital PLL 8 of FIG. 1. In FIG. 2, a numeral 803 denotes a 1/X frequency divider, which corresponds to the 1/M frequency divider 804 of FIG. 3 and its frequency dividing ratio X is selected among several frequency dividing ratios prepared therein, under control of the control unit 28, so as to correspond to the frequency of the reference frequency signal 18 outputted by the selectable clock multiplier 7. Other components are the same with the digital PLL 34 of FIG. 4.

The frequency ratio of the reference frequency signal 18 to the receiving clock signal 4 having the frequency F is selectable by controlling the frequency multiplying ratio of the selectable clock multiplier 7. When the frequency multiplying ratio of the selectable clock multiplier 7 is controlled to be 2, 3 or 4, for example, and the 1/24 clock generator 6 divides the receiving clock frequency F by 24, the frequency of the reference frequency signal 18 becomes F/12, F/8 or F/6, respectively.

In the digital PLL 8 of FIG. 2, the frequency dividing ratio X of the 1/X frequency divider 803 is controlled in accordance with the frequency ratio of the reference frequency signal 18 to the receiving clock signal 4. So, the digital PLL 8 of FIG. 2 generates the output clock signal 16 which is phase-locked to the receiving clock signal 4 of the frequency F.

In the digital PLL 8 of FIG. 2, the cycle of the phase comparison performed by the phase comparator 802 can be controlled by changing the frequency of the reference frequency signal 18, and consequently by changing the frequency dividing ratio X of the 1/X frequency divider 803.

When the cycle of the phase comparison becomes long, the pull-in time becomes short, because the cycles of the phase difference detection and the phase correction become large. However, the jitter amount also becomes large, when the phase correction cycle becomes long.

On the other hand, when the cycle of the phase comparison becomes short, the pull-in time becomes long, the cycle of the phase difference detection and the phase correction becoming small. However, the jitter amount to be caused at each phase correction can be restrained within a small level.

Depending on the fluctuation level of the receiving clock signal 4, the most appropriate value of the frequency dividing ratio X might be determined. However, it is practically sufficient that the jitter amount be within its tolerance level.

Therefore, in the embodiment of FIG. 1, the jitter detection signal generator 19 is provided for detecting the current jitter amount and controlling the frequency dividing ratio X when the detected jitter amount exceeds its tolerance level.

The tolerance level of the jitter amount depends on operational conditions. Therefore, a threshold value of the jitter amount is set by an operator in the jitter detection threshold register 21, in the embodiment.

The jitter detection signal generator 19 generates the jitter detection signal 22 referring to the receiving clock signal 4 and a transmission clock signal 12 of FIG. 1. The jitter detection signal 22 is compared to the threshold value set in the jitter detection threshold register 21 by the comparator 20.

When the output 29 of the comparator indicates that the jitter amount exceeds the tolerance level, the clock selector 27 selects an appropriate value of the frequency dividing ratio X and the control unit 28 controls the digital PLL 8 and the selectable clock multiplier 7 to operate according to the selected frequency dividing ratio X.

In the jitter amount register 25, a table is prepared for showing the most appropriate value of the frequency dividing ratio X according to the jitter amount 22. Referring to the table, the clock selector 27 selects the frequency dividing ratio X, and consequently, the frequency multiplying ratio, whereby the control unit 28 controls the digital PLL 8 and the selectable clock multiplier 7.

In a preferred embodiment, there may be provided a monitor display which shows the current jitter amount 22 and the selected frequency dividing ratio X to the operator.

As heretofore described, a low-jitter data transmission signal can be realized with a simple and practical configuration.

What is claimed is:

1. A data transmission apparatus comprising:
   a receiving clock generator for dividing a frequency of a receiving clock signal which is extracted from a receiving optical signal carrying ATM (Asynchronous Transfer Mode) cells;
   a clock multiplier for generating a reference frequency signal by multiplying a frequency of an output of the receiving clock generator;
   a digital PLL (Phase Lock Loop) for generating an output clock signal referring to the reference frequency signal;
   a transmission-side signal generator for generating a transmission data signal and a transmission clock signal to be multiplexed into a transmission optical signal in synchronization with the output clock signal;
   a control unit for controlling a frequency multiplying ratio of the clock multiplier and controlling a frequency dividing ratio of a frequency divider provided in the digital PLL corresponding to the frequency multiplying ratio;
   a jitter detection signal generator for generating a jitter detection signal indicating a jitter amount relative to the receiving clock signal and the transmission clock signal;
   a comparator for comparing the jitter detection signal to a threshold value; and
   a clock selector for selecting a frequency of the reference frequency signal, according to which the control unit controls the frequency dividing ratio of the frequency divider and the frequency multiplying ratio of the clock multiplier.

2. A data transmission apparatus as recited in claim 1, further comprising a monitor display for displaying a current value of the jitter amount indicated by the jitter detection signal.

3. A data transmission apparatus as recited in claim 1, further comprising a jitter amount register for storing the jitter amount being associated with each possible frequency multiplying ratio of the clock multiplier.

4. A data transmission apparatus as recited in claim 3, wherein the clock selector selects the frequency of the reference frequency signal referring to data registered in the jitter amount register.

5. A data transmission apparatus as recited in claim 1, wherein:
   the receiving clock generator divides the frequency of the receiving clock signal by 24;
   the frequency multiplying ratio of the clock multiplier is controlled to be one of 2, 3 and 4; and
   the frequency dividing ratio of the frequency divider is controlled to be 12, 8, and 6, when the frequency multiplying ratio of the clock multiplier is controlled to be 2, 3 and 4, respectively.

* * * * *